United States Patent
Buijsse et al.

(10) Patent No.: US 7,285,785 B2
(45) Date of Patent: *Oct. 23, 2007

(54) APPARATUS WITH PERMANENT MAGNETIC LENSES

(75) Inventors: Bart Buijsse, Eindhoven (NL); Theodorus Hubertus Josephus Bisschops, Eindhoven (NL); Mark Theo Meuwese, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/418,730

(22) Filed: May 3, 2006

(65) Prior Publication Data

US 2006/0197030 A1     Sep. 7, 2006

Related U.S. Application Data

(63) Continuation of application No. 11/111,078, filed on Apr. 21, 2005, now Pat. No. 7,064,325.

(30) Foreign Application Priority Data

Apr. 22, 2004   (NL) ................... 1026006

(51) Int. Cl.
*H01J 1/50*       (2006.01)
*H01J 37/147*   (2006.01)
*H01J 37/26*     (2006.01)

(52) U.S. Cl. ............. 250/396 ML; 250/309; 250/310; 250/311

(58) Field of Classification Search ......... 250/396 ML
See application file for complete search history.

(56) References Cited

U.S. PATENT DOCUMENTS

| | | | | |
|---|---|---|---|---|
| 4,409,486 A | * | 10/1983 | Bates ............... | 250/396 ML |
| 4,639,597 A | * | 1/1987 | Shiokawa ............. | 250/305 |
| 4,999,496 A | * | 3/1991 | Shaw et al. .......... | 250/310 |
| 5,300,776 A | * | 4/1994 | Krivanek ............. | 250/307 |
| 5,374,817 A | * | 12/1994 | Bard et al. .......... | 235/462.35 |
| 6,057,553 A | * | 5/2000 | Khursheed et al. .... | 250/442.11 |
| 6,320,194 B1 | * | 11/2001 | Khursheed et al. .... | 250/442.11 |
| 6,515,287 B2 | * | 2/2003 | Notte, IV ............ | 250/396 ML |
| 6,552,340 B1 | * | 4/2003 | Krivanek et al. ...... | 250/310 |
| 6,891,167 B2 | * | 5/2005 | Notte, IV ............ | 250/396 ML |
| 7,064,325 B2 | * | 6/2006 | Buijsse et al. ....... | 250/310 |

(Continued)

FOREIGN PATENT DOCUMENTS

JP       2003346697 A   * 12/2003

*Primary Examiner*—Robert Kim
*Assistant Examiner*—Bernard Souw
(74) *Attorney, Agent, or Firm*—Scheinberg & Griner, LLP; Michael O. Scheinberg (57) ABSTRACT

The invention describes a particle-optical apparatus arranged to focus a beam (1) of electrically charged particles with the aid of two particle-optical lens systems (10, 20). The lens action is achieved by magnetic fields, which fields are generated by permanent-magnetic materials (13, 23). In contrast to magnetic lenses equipped with a coil, it is not easy in the case of lenses equipped with permanent-magnetic material to alter the focusing magnetic field with the aim of altering the optical power. In an apparatus according to the invention, the optical power of the lens systems is altered by altering the energy with which the beam (1) traverses the lens systems (10, 20). This can easily happen by altering the voltage of electrical power supplies (14, 24).

24 Claims, 3 Drawing Sheets

U.S. PATENT DOCUMENTS

| | | | |
|---|---|---|---|
| 7,067,820 B2 * | 6/2006 | Buijsse | 250/396 ML |
| 2005/0236568 A1 * | 10/2005 | Buijsse et al. | 250/310 |
| 2006/0175411 A1 * | 8/2006 | Itou | 235/462.01 |
| 2006/0197030 A1 * | 9/2006 | Buijsse et al. | 250/396 ML |

* cited by examiner

APPARATUS WITH PERMANENT MAGNETIC LENSES

This application is a continuation of U.S. application Ser. No. 11/111,078, filed on Apr. 21, 2005, now U.S. Pat. No. 7,064,325, which is hereby incorporated by reference.

The invention relates to a particle-optical apparatus arranged to:

Focus a beam of electrically charged particles with the aid of a first particle-optical lens system and a second particle-optical lens system;

In which lens system the lens action is at least partially realized by magnetic fields;

Which magnetic fields are generated by permanent-magnetic materials.

Such an apparatus is known from U.S. Pat. No. 6,320,194.

Apparatus as described above are used nowadays inter alia in studying samples. In irradiating a sample with a focused beam of charged particles, information can be obtained in various manners, such as with the aid of secondary particles and radiation locally excited in the sample. By collecting and processing this information with the aid of detectors, insight is obtained into certain physical properties of the sample. Because the beam can have a very small diameter, the positional dependence of this information can be determined with a high spatial accuracy.

To collect this information, it is desirable to be able to vary beam parameters such as the beam current, beam energy and beam diameter at the location of the sample. This provides the possibility of, for example, first localizing on the sample a microscopically small structure that is to be investigated, e.g. with the aid of a relatively high beam current, and subsequently studying this structure with another beam energy or current.

As is known to the skilled artisan, the beam in a particle-optical apparatus is focused by particle-optical lens systems. The magnetic and/or electric fields present in such a lens system have a focusing action on the beam. Particularly in those cases in which the beam consists of electrons, a magnetic lens system is usually employed, because, in using such a lens system, the lens errors are generally smaller than the lens errors that occur in the case of an electrostatic lens system. By now varying the optical power of such a lens system, the possibility arises of varying the beam parameters.

The optical power of such a magnetic lens system is varied by varying the strength of the magnetic field. To this end, the magnetic field is usually generated by an electromagnetic coil. The current necessary to generate the magnetic field will cause heat dissipation in the coil. The physical dimensioning of the magnetic lens system is determined in large part by the size of the coil and the space required for any cooling means that may be employed. These cooling means, such as a water cooling spiral, may be necessary to limit undesired consequences of the dissipation, such as mechanical changes as a result of the temperature changes of the pole pieces that guide the magnetic field.

The use of permanent-magnetic material to generate the magnetic field in a magnetic lens system has the advantage that a more compact magnetic lens system can be made, inter alia because no heat dissipation occurs in this case. However, when using permanent-magnetic material, it is not possible to vary the magnetic field in a simple manner.

In the field of particle-optical apparatus, it is desirable to have a compact particle-optical apparatus. There is also a need for flexible particle-optical systems, in which beam parameters can be varied in a simple and fast manner.

In said US patent document, a particle-optical apparatus is described that is equipped with a particle-optical column. This column comprises an electron source and a condenser lens system equipped with permanent-magnetic material. Although it cannot be directly derived from the patent document, it is customary for the skilled artisan to electrically connect the various parts of the magnetic circuit and the sample to earth potential. The beam of electrons emerging from the electron source is accelerated to a desired energy. Thereafter, the beam is focused on the sample using magnetic lens systems, i.e. the condenser lens system and an objective lens system. Using scanning coils (not depicted), the focused beam is moved across a sample, whereby emerging radiation is detected with the aid of a detector.

The desired flexibility is achieved in the known apparatus by making at least the electron source and the condenser lens system mechanically exchangeable, i.e. by replacing the electron source and the condenser lens system by another electron source and another condenser lens system. If it is desired to conduct inspection using another beam parameter, a portion of the column is replaced by a portion of the column with other optical properties. Moreover, it is shown how a fine control of the magnetic field is made possible via mechanical adjustments to the magnetic circuit (the co-called "bypass circuit") and by addition of relatively small coils.

The exchange of the electron source and the condenser lens system as referred to in said US patent document does indeed offer the desired flexibility of the beam parameters, but is less suitable when it is desired to irradiate a sample using different beam parameters in a short span of time. Said exchange is a relatively laborious solution, whereby variation of the beam parameters requires considerable time compared to the time necessary to study the sample. Moreover, in the known apparatus, there is a danger that, after the (mechanical) exchange of the electron source and the condenser lens system, the position of the beam with respect to the sample is insufficiently known to allow easy re-location of a microscopically small structure on the sample that was found prior to said exchange.

The invention aims to provide a particle-optical apparatus with a compact column, whereby beam parameters can be varied in a simple and fast manner.

To this end, an apparatus according to the invention is characterized in that the beam traverses the first lens system with an energy different to the energy with which the beam traverses the second lens system.

The invention is based upon the inventive insight that it is possible to achieve the desired flexibility of the lens systems, not by varying the focusing magnetic field of the lens systems, but by varying the energy of the beam as it traverses these focusing magnetic fields. This is because the optical power of a magnetic lens system is not only dependent upon the focusing magnetic field, but is also dependent upon the energy of the beam at the location of the focusing magnetic field. By suitably choosing the energy of the beam as it traverses the magnetic lens system, it is possible to adjust the optical power.

The energy with which the beam traverses a lens system can be varied by accelerating or retarding the beam with the aid of an electrostatic field prior to traversal of the lens system. In traversing the electrostatic fields that cause a retardation or acceleration, a lens action will also occur, as is known to the skilled artisan. The lens actions of the magnetic and electrostatic fields together determine the beam parameters.

In another embodiment of the apparatus according to the invention, the beam, in traversing the first lens system, moves within a first tube of electrically conductive material that is surrounded by the first lens system, and, in traversing the second lens system, moves within a second tube of electrically conductive material that is surrounded by the second lens system.

The two tubes of electrically conductive material determine the energy of the beam within those tubes, and thereby the energy with which the beam traverses the focusing magnetic fields. The tubes are electrically isolated from each other and from earth, so that they can carry different voltages.

It should be mentioned that the two tubes have to be made of a non-magnetizable material, so that the tubes will not hinder penetration of the focusing magnetic field as far as the axis.

As is known to the skilled artisan, it is necessary for the beam to propagate through a vacuum. Said tube can function as a vacuum barrier, whereby vacuum prevails within the tube and a higher pressure, e.g. atmospheric pressure, prevails outside the tube.

An advantage of this embodiment is that the permanent-magnetic material, which generates the magnetic field, and any pole pieces that are present, which serve to guide the magnetic flux produced by the permanent-magnetic material toward the beam, are located outside of vacuum. In this way, no special demands are made as regards the vacuum compatibility of the material of the pole pieces and the permanent magnetic material.

In yet another embodiment of the apparatus according to the invention, each of the lens systems is provided with a flux guiding circuit for guiding the flux generated by the permanent magnetic materials, each of which flux guiding circuits carries a different electrical voltage.

In this embodiment, the flux guiding circuits are located at least partially in the vacuum in which the beam propagates. The flux guiding circuits comprise pole pieces of magnetizable material. By connecting each of these pole pieces to a corresponding electrical voltage source, these pole pieces determine the energy with which the beam traverses the focusing magnetic fields of the lens system concerned.

An advantage of this embodiment is that, by using the pole pieces both to guide the magnetic field and to determine the energy of the beam, it is possible to make a very compact lens system. This makes it possible to realize a compact particle-optical apparatus.

In yet another embodiment of the apparatus according to the invention, a voltage difference prevails between parts of the flux guiding circuit of at least one of the lens systems.

The energy of the beam varies during traversal of the lens system concerned. As a result of this, a change in optical power occurs w.r.t. the situation whereby no voltage difference is applied between the parts of the flux guiding circuit.

An advantage of this embodiment is that it is, for example, possible to assign to one of the pole pieces a fixed voltage w.r.t. earth, and yet is also possible to vary the optical power of the lens system. This is particularly attractive in the case of the pole piece that is closest to the sample to be investigated. This is because, in connection with the detection of, for example, secondary electrons, it is often desirable that the sample and the pole piece closest thereto be connected to earth. It is also possible, for example, where use is made of an electron source in the form of an electron field emitter, to employ the pole piece that is closest to the field emitter as an extraction electrode.

In yet another embodiment of the apparatus according to the invention, the magnetization direction of the permanent-magnetic material in the two lens systems is mutually chosen in such a manner that, between the two lens systems, there is located a plane in which there is essentially no magnetic flux present parallel to an axis passing through the middle of the lens systems.

A complication in designing particle-optical lens systems with permanent-magnetic material is that, as a result of using permanent-magnetic material, it is possible for scatter fields to occur outside the lens system. As is known to the skilled artisan, this is a direct consequence of Ampere's law, which states that the closed-loop integral $\oint Bds$ is zero in a situation whereby no current-carrying portions are enclosed, where B is the magnetic field and s is a (closed) path. So as to cancel the effects of said scatter fields, which are usually undesirable, it is customary to magnetically shield the beam by surrounding the beam by magnetizable material to as great an extent as possible. However, such surrounding by magnetizable material is generally undesirable, since this leads to a more complex construction. This is also undesirable because, as a consequence, access to regions in the vicinity of the beam, e.g. so as to be able to place and operate vacuum valves there, is made more difficult.

By suitably choosing the direction of magnetization in the permanent-magnetic material in one lens system w.r.t. the magnetization direction in the other lens system, it is possible to compensate the scatter field of the first lens system with the scatter field of the second lens system. In this way, it is possible to identify between the two lens systems a plane where there is no magnetic flux present parallel to the axis passing through the middle of the two lens systems. In the space around this plane, it is possible to remove the magnetizable material without, as a consequence, significant change to the magnetic fields on the axis. This is because, if there is no magnetic flux, the presence of magnetizable material will not be relevant.

The absence of magnetizable material in a space between the lens systems now makes it simple to mutually electrically isolate the lens systems, so that a voltage difference can be applied between the lens systems.

Another advantage occurs when the particle-optical apparatus is of a type whereby the sample is positioned between the lenses, as in the case of a Transmission Electron Microscope (TEM). It is then attractive to place the sample in a space that is essentially free of magnetic fields, so that magnetization of the sample and sample holder (probe) will not have any influence on image formation in the particle-optical apparatus. However, it is also desirable to have good spatial access to the sample position, so as to be able to place, for example, detectors and/or cooling means there. As a result of the presence of a region in which there is essentially no flux parallel to the axis passing through the middle of the two lens systems, it is easy to satisfy both of these desires.

The invention will be elucidated on the basis of figures, whereby identical reference numerals indicate corresponding elements. To this end.

Figure 1:
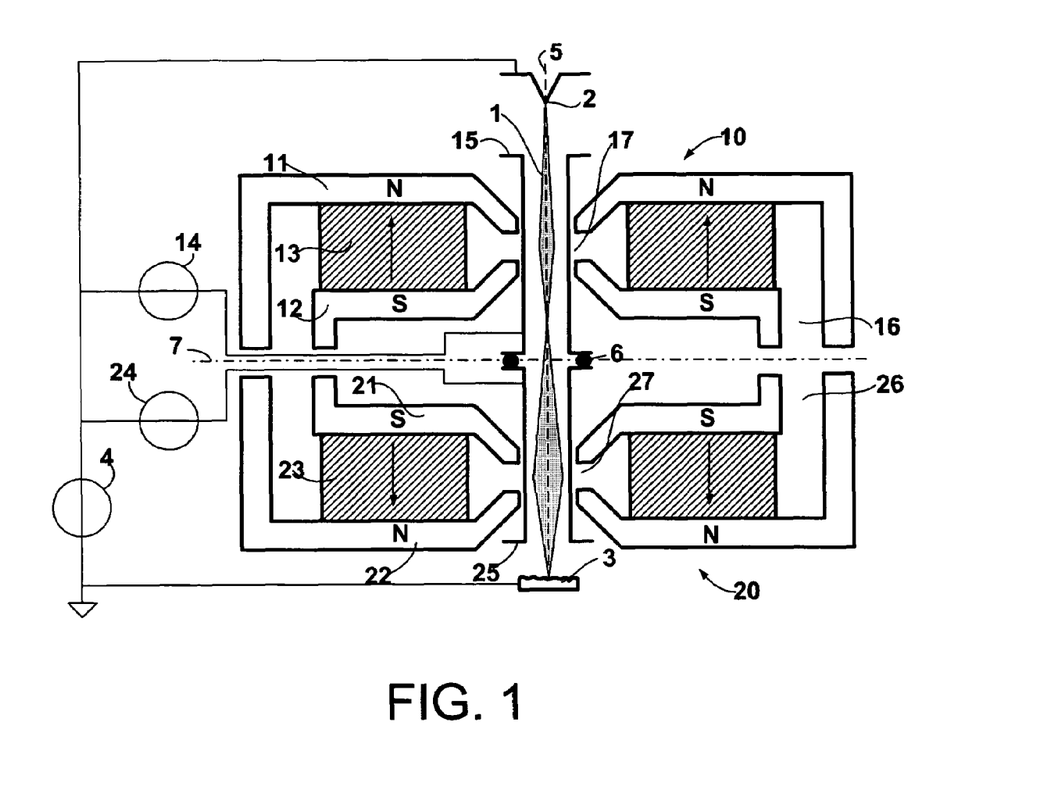
FIG. 1 schematically depicts a particle-optical apparatus according to the invention, whereby the beam runs inside a tube.

FIG. 1 schematically depicts a particle-optical apparatus according to the invention, whereby the beam runs inside a tube.

An electron source 2 and a sample 3 to be investigated are located on an optical axis 5. Between the electron source 2 and the sample 3 are located a first lens system 10 and a second lens system 20, which lens systems 10 and 20 demonstrate rotational symmetry about the optical axis 5.

The electron source is connected to an electrical power supply 4, with which the electron source is maintained at an electrical voltage w.r.t. earth. Lens system 10 is connected to an electrical power supply 14 and is kept at a voltage w.r.t. the electron source 2. In the same way, electrical power supply 24 is used to keep lens system 20 at a voltage w.r.t. the electron source.

The first lens system 10 comprises a tube 15 disposed around the optical axis 5. Around this tube 15, a ring 13 of permanent-magnetic material is placed, whose magnetization is oriented parallel to the axis 5. Pole pieces 11 and 12 are mounted on this ring 13, so as to guide the magnetic flux generated by the ring 13 toward a region 17 around the optical axis 5. In this region 17, the flux will cross over from one pole piece to the other, and thereby cause a magnetic field about the axis 5. Because the pole pieces 11 and 12 are not allowed to be magnetically connected to one another (this would, after all, cause a magnetic short-circuit of the ring 13 of permanent-magnetic material), flux also crosses over from one pole piece to the other in a region 16, in addition to region 17.

In the same way, the second lens system 20 comprises a tube 25 disposed around the optical axis, a ring 23 of permanent-magnetic material, and pole pieces 21 and 22, whereby the flux crosses over from one pole piece to the other in the regions 26 and 27.

The tubes 15 and 25 are electrically isolated from one another by an insulator 6, so that a voltage difference may exist between the tubes.

A beam 1 of electrically charged particles, such as electrons, is emitted along the optical axis 5 from a particle source such as the electron source 2. The beam 1 is accelerated by the voltage difference between the electron source 2 and the tube 15, as caused by the electrical power source 14. The beam 1 is focused by the magnetic field present in region 17, pertaining to lens system 10. As a result of the voltage difference between the tubes 15 and 25, the energy of the beam 1 will alter in going from tube 15 to tube 25. With this altered energy, which is determined by the electrical power supply 24, the beam 1 will be focused by the magnetic field present in region 27, pertaining to lens system 20. Eventually, the beam 1 will intercept the sample 3 with a landing energy that is determined by the electrical power supply 4. Radiation, such as secondary electrons, will hereby be generated. This radiation can be detected using (non-depicted) detectors.

Alteration of beam parameters can be easily achieved in this embodiment. When, for example, in investigating the sample 3, it is necessary to raise the landing energy with which the beam 1 intercepts the sample 3, this can be easily achieved by raising the voltage of the electrical power supply 4. The energy with which the beam 1 traverses the lens systems 10 and 20 will not change as a result of changing the voltage of power supply 4, and, accordingly, the focusing action of the magnetic fields of the lens systems 10 and 20 will also not change.

As a result of this alteration of the landing energy, the lens action of the electrostatic fields present can change. This is because the magnetic and electrostatic fields together determine the beam parameters. This change in the lens action of the electrostatic fields can be compensated for by a small alteration to the focusing action of the magnetic field of, for example, lens system 20, by slightly varying the voltage of the electrical power supply 24.

Likewise, the beam parameters can be altered—while keeping constant, for example, the energy with which the beam 1 intercepts the sample—by letting lens system 10 focus more strongly, by lowering the energy of the beam, and, concurrently, by letting lens system 20 focus less strongly, by raising the energy of the beam in lens system 20.

Focusing of the beam 1 upon the sample 3 can also occur by varying the voltage of the electrical power supply 24, and thereby the energy with which the beam traverses lens system 20. The landing energy will not change as a result of such action.

It should be mentioned that it is also possible to connect the voltage sources 14 and 24 on one side to, for example, earth. Only the voltage that is present on the tubes 15 and 25 is of importance.

Figure 2:
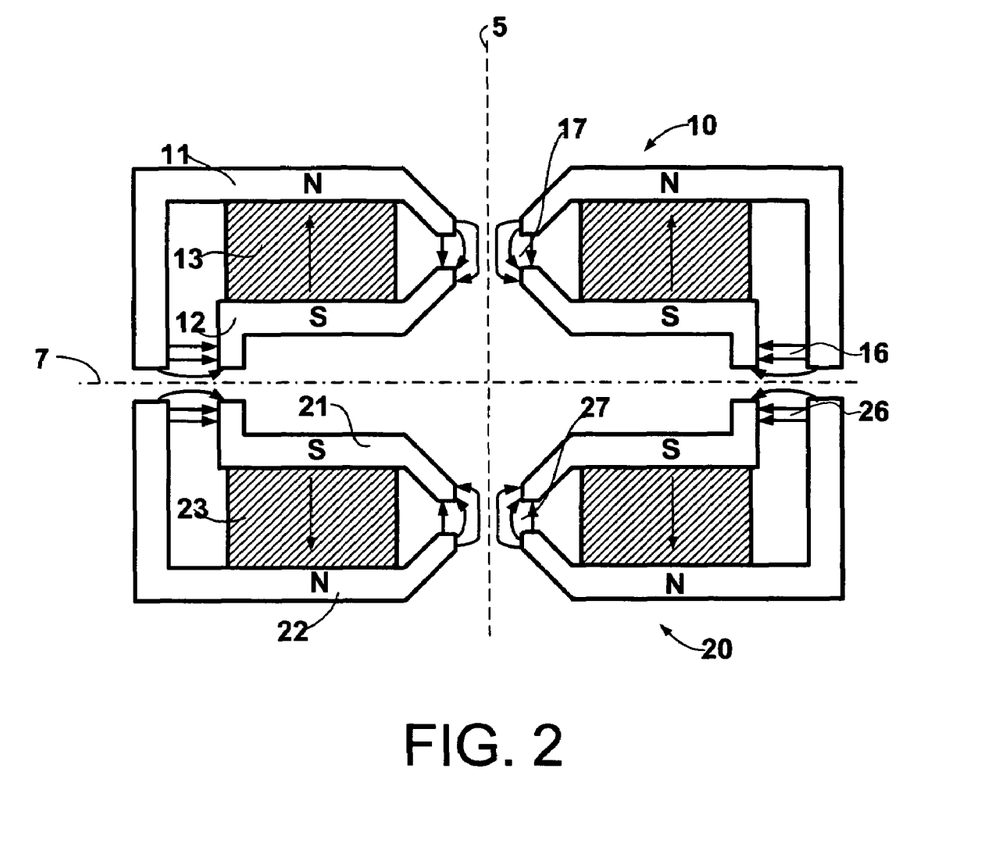
FIG. 2 schematically shows how the flux runs in both lens systems.

FIG. 2 schematically shows how the flux runs in both lens systems.

In region 17, the flux crosses over from pole piece 11 to pole piece 12. The axially symmetric magnetic field thereby generated causes the desired lens action of the lens system 10. Where the lens action is concerned, the polarity of the magnetic field is unimportant. Besides in region 17, flux will also cross over in region 16.

Likewise, the magnetic field that causes the lens action of the lens system 20 is generated in region 27. In this case also, the polarity of the magnetic field is unimportant. Besides in region 27, flux will also cross over in region 26.

By choosing the mutual magnetization of the lens systems 10 and 20 in such a manner that the radial component of the flux in region 16 has the same direction as the radial component of the flux in region 26, one can prevent the cross-over of flux between the lens systems 10 and 20. Because no flux crosses over between the lens systems 10 and 20, it is also not necessary to have magnetizable material between the lens systems so as to guide the flux. As a result, good spatial accessibility of the region between the lens systems 10 and 20 is made possible. This is advantageous when, in this space, (non-depicted) vacuum valves have to be placed and operated.

It should be mentioned that, although in the depicted figure, as a result of the employed mirror symmetry w.r.t. the symmetry plane 7, it can easily be seen that no flux crosses over between the lens systems 10 and 20, a plane between the lens systems 10 and 20 where there is no flux cross-over will also be present in embodiments in which this symmetry is absent.

Figure 3:
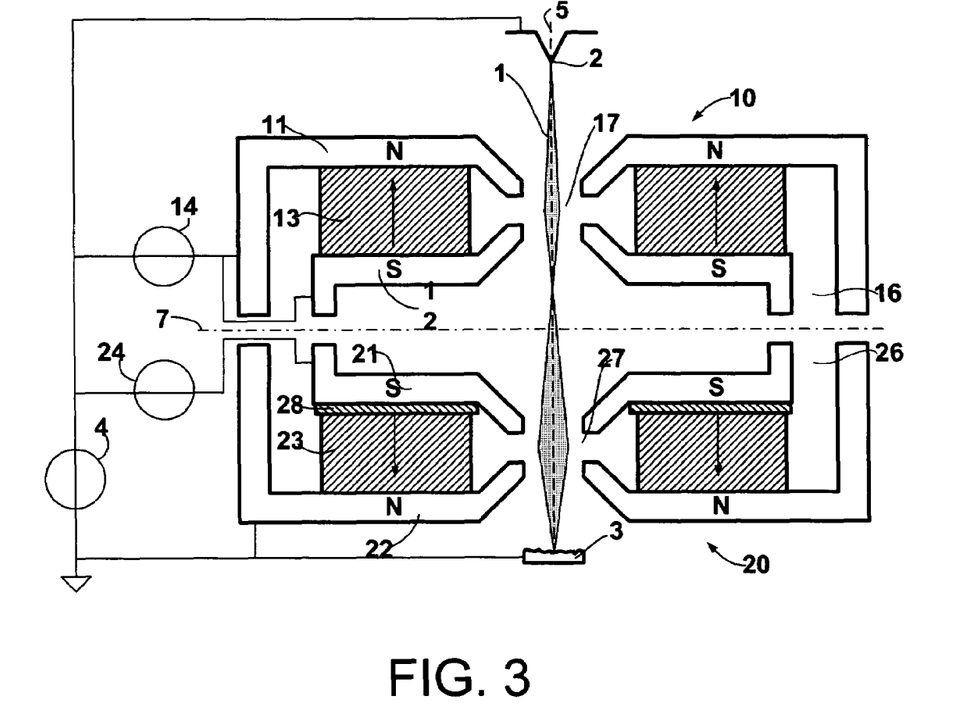
FIG. 3 schematically illustrates a particle-optical apparatus according to the invention, whereby the pole pieces are at an electrical voltage.

FIG. 3 can be regarded as having arisen from FIG. 1, whereby the energy of the beam 1 is not determined by the electrical voltages of the tubes 15 and 25 depicted in FIG. 1, but is determined by the electrical voltages that are present on the pole pieces 11,12, 21 and 22.

The electrical power supply 14 causes a voltage difference between electron source 2 and the pole pieces 11 and 12. As a result of this voltage difference, the energy of the beam is determined in traversing the focusing magnetic field of lens system 10.

Lens system 20 additionally has an electrical insulator 28. As a result of this, it is possible to give pole piece 21 a different electrical voltage than pole piece 22. By connecting pole piece 21 to the electrical power supply 24 and connecting pole piece 22 to earth, a situation is achieved whereby the (average) energy with which the beam traverses the focusing magnetic field of lens system 20 is determined by this power source and power source 4. Because both pole piece 22 and the sample 3 are connected to earth, the space between pole piece 22 and the sample 3 will be a space free of electrical fields. This latter situation is advantageous because electrical fields in this space might hinder, or at least complicate, the detection of radiation and electrically charged secondary particles by (non-depicted) detectors.

It should be mentioned that, although as depicted in FIGS. 1 and 3 the beam 1 demonstrates a focus between the lens systems 10 and 20, this is generally not necessary.

The invention claimed is:

1. A particle-optical apparatus arranged to:
   focus a beam of electrically charged particles with the aid of a first particle-optical lens system and a second particle-optical lens system;
   in which lens system the lens action is at least partially realized by magnetic fields;
   which magnetic fields are generated by permanent-magnetic materials, characterized in that
   the beam traverses the first lens system with an energy different from the energy with which the beam traverses the second lens system.

2. A particle-optical apparatus according to claim 1, in which the beam, in traversing the first lens system, moves within a first tube of electrically conductive material that is surrounded by the first lens system, and, in traversing the second lens system, moves within a second tube of electrically conductive material that is surrounded by the second lens system, which tubes carry mutually different electrical voltages.

3. A particle-optical apparatus according to claim 1, in which each of the lens systems is provided with a flux guiding circuit for guiding the flux generated by the permanent magnetic materials, each of which flux guiding circuits carries a different electrical voltage.

4. A particle-optical apparatus according to claim 3, in which an electrical voltage difference prevails between parts of the flux guiding circuit of at least one of the lens systems.

5. A particle-optical apparatus according to claim 1, in which the magnetization directions of the permanent-magnetic materials in the two lens systems are mutually chosen in such a manner that, between the two lens systems, there is located a plane in which there is essentially no magnetic flux present parallel to an axis passing through the middle of the lens systems.

6. A particle-optical apparatus according to claim 2, in which the magnetization directions of the permanent-magnetic materials in the two lens systems are mutually chosen in such a manner that, between the two lens systems, there is located a plane in which there is essentially no magnetic flux present parallel to an axis passing through the middle of the lens systems.

7. A particle-optical apparatus, comprising;
   a source of charged particles;
   a first particle-optical lens system including a first permanent magnet;
   a second particle-optical lens system including a second permanent magnet; and
   at least one element within the first particle-optical lens system or the second particle-optical lens system to which a voltage can be applied to alter the electric field within the corresponding one of the first or second lens system;
   a sample holder for holding a sample, wherein the electrical potential within the first particle-optical lens system, within the second particle-optical lens system, or within both particle-optical lens systems being adjustable independently of the electrical potential between the source of charged particles and the sample.

8. A charged particle apparatus according to claim 7 in which the electrical potential within the first particle-optical lens system and the electrical potential within the second particle-optical lens system can be adjusted independently of each other.

9. A charged particle apparatus according to claim 7 in which the at least one element to which a voltage can be applied includes an electrically conductive tube positioned so that the charged particles travel through the tube.

10. A charged particle apparatus according to claim 7 in which the at least one element to which a voltage can be applied includes a magnetic flux guide for guiding the flux from the first permanent magnet or from the second permanent magnet.

11. A charged particle apparatus according to claim 7 in which the at least one element to which a voltage can be applied includes at least two elements, one element in each of the first and second lens systems.

12. A charged particle apparatus according to claim 11 in which the at least one element to which a voltage can be applied in each of the first and second lens systems includes a first electrically conductive tube in the first lens system and a second electrically conductive tube in the second lens system, the electrical potential of the first and second tubes being independently adjustable.

13. A charged particle apparatus according to claim 11 in which the at least one element to which a voltage can be applied in each of the first and second lens systems includes at least one first flux guide for guiding the flux generated by the first permanent magnet and at least one second flux guide for guiding the flux generated by the second permanent magnet.

14. A charged particle apparatus according to claim 13 in which the at least one first flux guide includes a first set of two first flux guides and in which the at least one second flux guide includes a second set of two second flux guides, each of the two first flux guides being at substantially the same first voltage and each of the two second flux guides being at substantially the same second voltage, the second voltage being different from the first voltage.

15. A charged particle apparatus according to claim 7 in which the magnetization directions of the first permanent magnet and the second permanent magnet are mutually chosen in such a manner that, between the two lens systems, there is located a plane in which there is essentially no magnetic flux present parallel to an axis passing through the middle of the lens systems.

16. A charged particle apparatus according to claim 7 in which the source of charged particles comprises a source of electrons.

17. A method of directing a charged particle beam toward a sample, comprising:
   generating a beam of charged particles from a charged particle source;
   directing the beam of charged particles through a first magnetic field of a first permanent magnet of a first lens systems and a second magnetic field of a second permanent magnetic of a second lens system;
   adjusting the beam properties by altering the voltage on an element within the first lens system, the voltage on an element within the second lens system, or the voltage on elements within both lens systems.

18. The method of claim 17 further comprising passing the charged particle beam through an electrically conductive tube within each of the first and second lens systems, and in which adjusting the beam properties includes adjusting the voltage applied to one or both of the electrically conductive tubes.

19. The method of claim 17 in which each of the first and second lens systems includes guides for the guiding magnetic flux and in which adjusting the beam properties includes adjusting the voltage applied to one or both of the guides for the magnetic flux.

20. The method of claim 17 in which directing the beam of charged particles through a first magnetic field of a first permanent magnet of a first lens systems and a second magnetic field of a second permanent magnetic of a second lens system includes directing the beam of charged particles through a first and second lens system in which the magnetization directions of the permanent-magnetic materials in the two lens systems are mutually chosen in such a manner that, between the two lens systems, there is located a plane in which there is essentially no magnetic flux present parallel to an axis passing through the middle of the lens systems.

21. The method of claim 17 in which adjusting the beam properties includes applying a first voltage to an element of the first lens system and applying a different voltage to an element of the second lens system.

22. The method of claim 17 in which adjusting the beam properties includes adjusting a voltage between the charged particle beam source and the sample, without significantly altering the energy of the charged particles within the first and second lens system.

23. The method of claim 17 in which adjusting the beam properties includes altering the beam energy in the first or second lens system without significantly altering the landing energy of the charged particles.

24. A method of directing a charged particle beam toward a sample, comprising:
generating a beam of charged particles from a charged particle source;
directing the beam of charged particles through a first magnetic field of a first permanent magnet of a first lens systems and a second magnetic field of a second permanent magnetic of a second lens system;
adjusting the beam properties by altering the potential energy within the first lens system, the second lens system, or within both lens systems to vary the potential energy gradient from the uniform gradient produced by the potential applied between the charged particle beam source and the sample.

* * * * *

UNITED STATES PATENT AND TRADEMARK OFFICE
CERTIFICATE OF CORRECTION

PATENT NO. : 7,285,785 B2 Page 1 of 1
APPLICATION NO. : 11/418730
DATED : October 23, 2007
INVENTOR(S) : Bart Buijsse, Theodorus Hubertus Josephus Bisschops and Mark Theo Meuwese It is certified that error appears in the above-identified patent and that said Letters Patent is hereby corrected as shown below:

Col. 1, Line 17, please change "inter" to read -- *inter* --

Col. 1, Line 18, please change "alia" to read -- *alia* --

Col. 1, Line 61, please change "inter alia" to read -- *inter alia* --

Col. 6, Line 8, please change "sample- by" to read -- sample 3- by --

Signed and Sealed this

Sixth Day of May, 2008

JON W. DUDAS
*Director of the United States Patent and Trademark Office*